(12) United States Patent
Hansen et al.

(10) Patent No.: US 9,652,584 B2
(45) Date of Patent: May 16, 2017

(54) AIRCRAFT DESIGN SYSTEMS AND METHODS

(75) Inventors: Allan M. Hansen, Glencoe, MO (US); Bradley K. Jackson, Florissant, MO (US); Lawrence W. Rogers, Kenmore, WA (US); Scott A. Schieferdecker, O'Fallon, MO (US); David W. Patterson, Everett, WA (US); Brian K. Thompson, Auburn, WA (US); Carl A. Bouffiou, Tacoma, WA (US); Thomas S. Strevey, Marysville, WA (US)

(73) Assignee: The Boeing Company, Chicago, IL (US)

( * ) Notice: Subject to any disclaimer, the term of this patent is extended or adjusted under 35 U.S.C. 154(b) by 1245 days.

(21) Appl. No.: 12/965,870

(22) Filed: Dec. 11, 2010

(65) Prior Publication Data
US 2011/0172795 A1 Jul. 14, 2011

Related U.S. Application Data

(63) Continuation-in-part of application No. 12/846,760, filed on Jul. 29, 2010, now abandoned, which is a continuation of application No. 10/699,265, filed on Oct. 31, 2003, now abandoned.

(51) Int. Cl.
*G06F 17/50* (2006.01)
*G06Q 10/06* (2012.01)

(52) U.S. Cl.
CPC ......... *G06F 17/5095* (2013.01); *G06Q 10/06* (2013.01)

(58) Field of Classification Search
None
See application file for complete search history.

(56) References Cited

U.S. PATENT DOCUMENTS

| | | | | |
|---|---|---|---|---|
| 4,796,194 A | * | 1/1989 | Atherton | 700/103 |
| 4,945,488 A | * | 7/1990 | Carver et al. | 700/182 |
| 5,515,524 A | * | 5/1996 | Lynch et al. | 703/13 |
| 5,586,052 A | * | 12/1996 | Iannuzzi et al. | 703/1 |
| 5,659,478 A | * | 8/1997 | Pennisi et al. | 700/95 |
| 5,680,530 A | * | 10/1997 | Selfridge et al. | 345/440 |
| 5,708,798 A | * | 1/1998 | Lynch et al. | 703/1 |
| 5,745,765 A | * | 4/1998 | Paseman | 717/107 |
| 5,825,651 A | | 10/1998 | Gupta et al. | |
| 6,108,700 A | * | 8/2000 | Maccabee et al. | 709/224 |
| 6,405,308 B1 | | 6/2002 | Gupta et al. | |

(Continued)

OTHER PUBLICATIONS

John A. Reed, Gregory J. Follen, and Abdollah A. Afjeh. 2000. Improving the aircraft design process using Web-based modeling and simulation. ACM Trans. Model. Comput. Simul. 10, 1 (Jan. 2000), 58-83.*

*Primary Examiner* — Christopher E Everett
(74) *Attorney, Agent, or Firm* — Miller, Matthias & Hull LLP

(57) ABSTRACT

A system comprises a configurator for providing a configuration definition that specifies existing engineering designs and manufacturing capability of aircraft structures that have already been designed and manufactured; and a processor for accessing the configuration definition from the configurator and filtering the configuration definition according to customer specifications for a new aircraft. The filtering selects existing designs and identifies existing manufacturing capability to fabricate structures for the new aircraft.

19 Claims, 15 Drawing Sheets

(56) References Cited

U.S. PATENT DOCUMENTS

| | | | |
|---|---|---|---|
| 6,604,089 | B1 | 8/2003 | Van Horn et al. |
| 6,631,356 | B1 | 10/2003 | Van Horn et al. |
| 6,675,294 | B1 | 1/2004 | Gupta et al. |
| 7,188,335 | B1 * | 3/2007 | Darr et al. .................... 717/121 |
| 7,236,914 | B1 * | 6/2007 | Zyskowski ....................... 703/8 |
| 7,302,443 | B2 * | 11/2007 | Nakajima et al. |
| 7,584,211 | B2 * | 9/2009 | Tamaru et al. |
| 7,840,432 | B2 * | 11/2010 | Lamb, III .................... 705/7.11 |
| 7,987,149 | B2 * | 7/2011 | Kulkarni et al. ................ 706/47 |
| 8,050,785 | B2 * | 11/2011 | Tanoue ........................... 700/97 |
| 8,060,237 | B2 * | 11/2011 | Franzen et al. .............. 700/182 |
| 2001/0016803 | A1 * | 8/2001 | Sartiono et al. .................. 703/1 |
| 2004/0098292 | A1 * | 5/2004 | Miller et al. ..................... 705/8 |
| 2006/0155402 | A1 * | 7/2006 | Read ............................... 700/97 |
| 2009/0228134 | A1 * | 9/2009 | Munk et al. ................... 700/167 |
| 2010/0145492 | A1 * | 6/2010 | Russell ......................... 700/103 |
| 2011/0178620 | A1 * | 7/2011 | Mohan et al. .................. 700/97 |

* cited by examiner

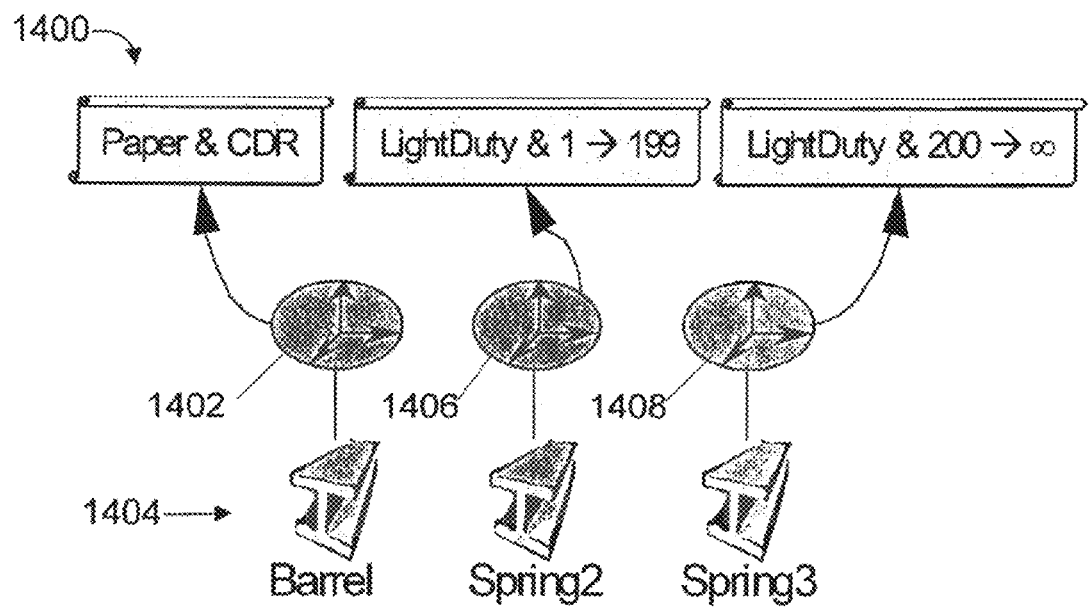
FIG. 14
FIG. 15
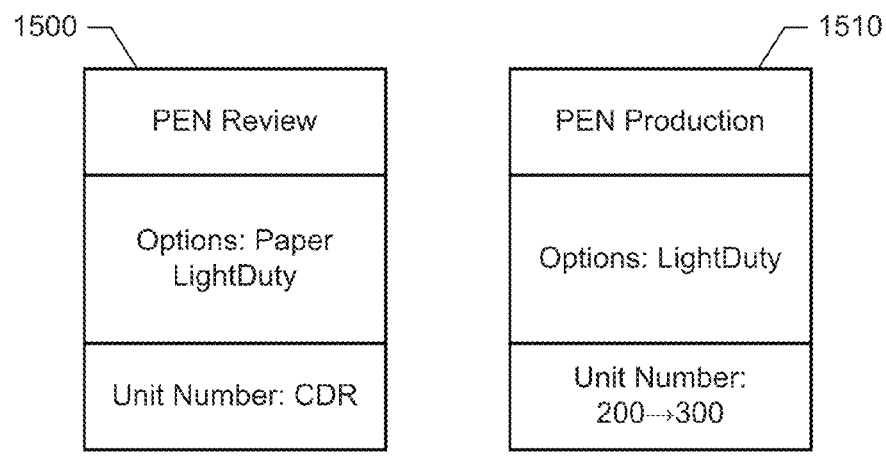

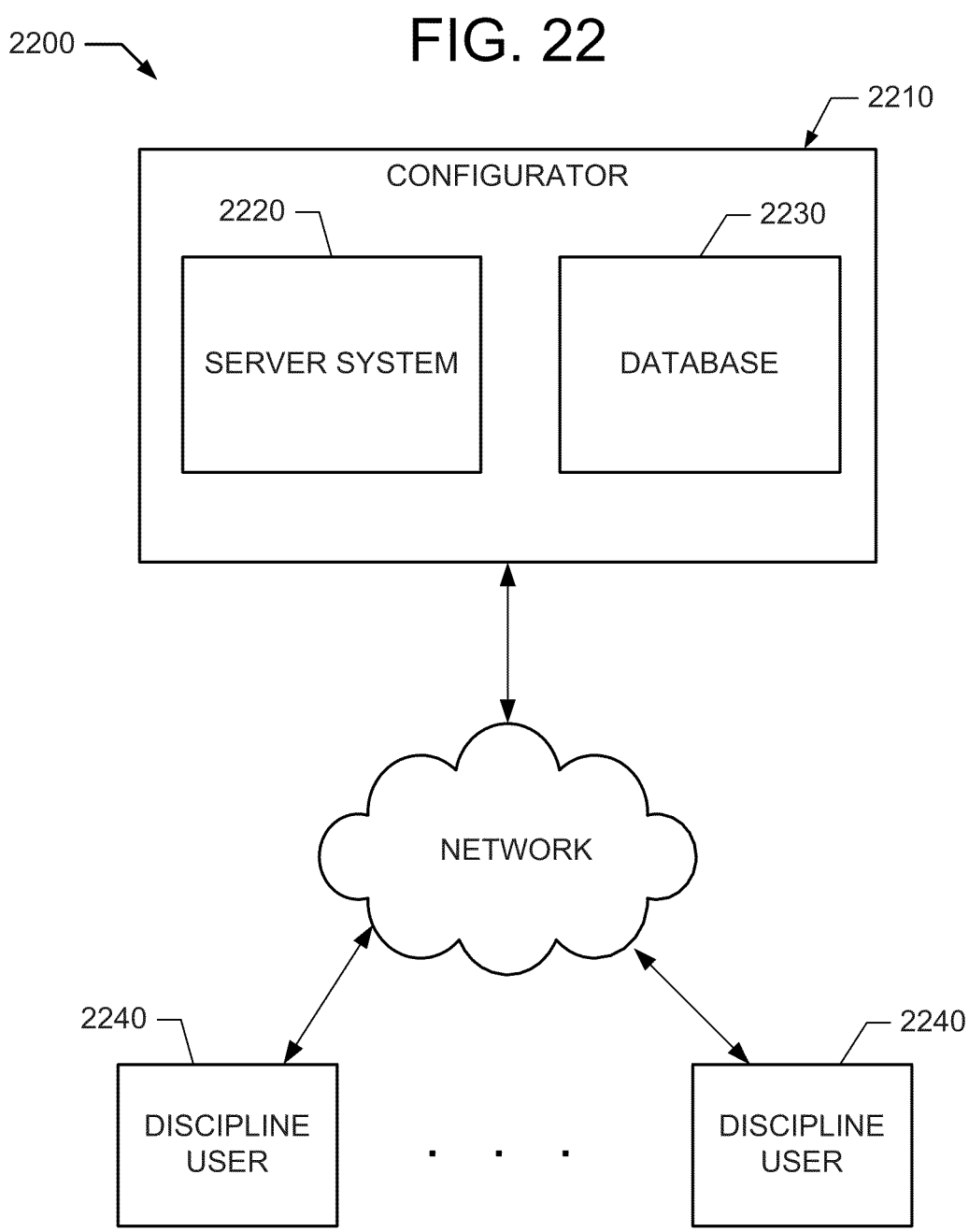

AIRCRAFT DESIGN SYSTEMS AND METHODS

This is a continuation-in-part of U.S. Ser. No. 12/846,760 filed 29 Jul. 2010, now abandoned. U.S. Ser. No. 12/846,760 was a continuation of U.S. Ser. No. 10/699,265 filed 31 Oct. 2003, now abandoned.

BACKGROUND

Aircraft are custom made products having a relatively low production rate. A customer specifies requirements for a new aircraft, and "options" are designed to be installed in the aircraft.

Designing the new aircraft includes defining aircraft structures (e.g., components and assemblies) and their relationships. During this phase, geometries of structures are created (e.g., by performing solid modeling), and analyzed.

After the aircraft is initially designed, manufacturability of the design is assessed. During this phase, the design is disassembled and then reconstructed according to available manufacturing processes. This phase includes tasks such as tool design, creation of CNC Machining instructions for the product's parts, and instructions for assembling the parts.

Designing a new aircraft is an ongoing and iterative process. As the design matures and all options are completed, and manufacturability has been assessed, the aircraft is built and assembled.

Design-to delivery of a new aircraft can take a long time. It would be desirable to shorten the design-to-delivery time.

SUMMARY

According to an embodiment herein, a system comprises a configurator for providing a configuration definition that specifies existing engineering designs and manufacturing capability of aircraft structures that have already been designed and manufactured; and a processor for accessing the configuration definition from the configurator and filtering the configuration definition according to customer specifications for a new aircraft. The filtering selects existing designs and identifies existing manufacturing capability to fabricate structures for the new aircraft.

According to another embodiment herein, a method comprises using a computer to access a configuration definition that specifies engineering designs and manufacturing capability of aircraft structures that have already been designed and manufactured; and filter the configuration definition according to custom specifications for a new aircraft, including selecting existing designs and identifying existing manufacturing capability to fabricate structures for the new aircraft.

According to another embodiment herein, a method comprises receiving modifications to a baseline model of an aircraft; and identifying existing engineering designs and manufacturing capability for the modifications, including searching a configuration definition that specifies existing engineering designs and manufacturing capability of aircraft structures that have already been manufactured.

In these embodiments, manufacturing capability is considered during the design of the new aircraft, and existing designs and existing manufacturing capability are reused in the new aircraft. In particular, design and manufacturing capability are brought together to analyze options. As a result, design-to delivery time of a new aircraft is reduced.

BRIEF DESCRIPTION OF THE DRAWINGS

FIG. 14 is an illustration of an applicability.

FIG. 15 is an illustration of a pair of configuration specifications

FIG. 22 is an illustration of a system for directing a new aircraft from design to delivery.

DETAILED DESCRIPTION

Figure 21:
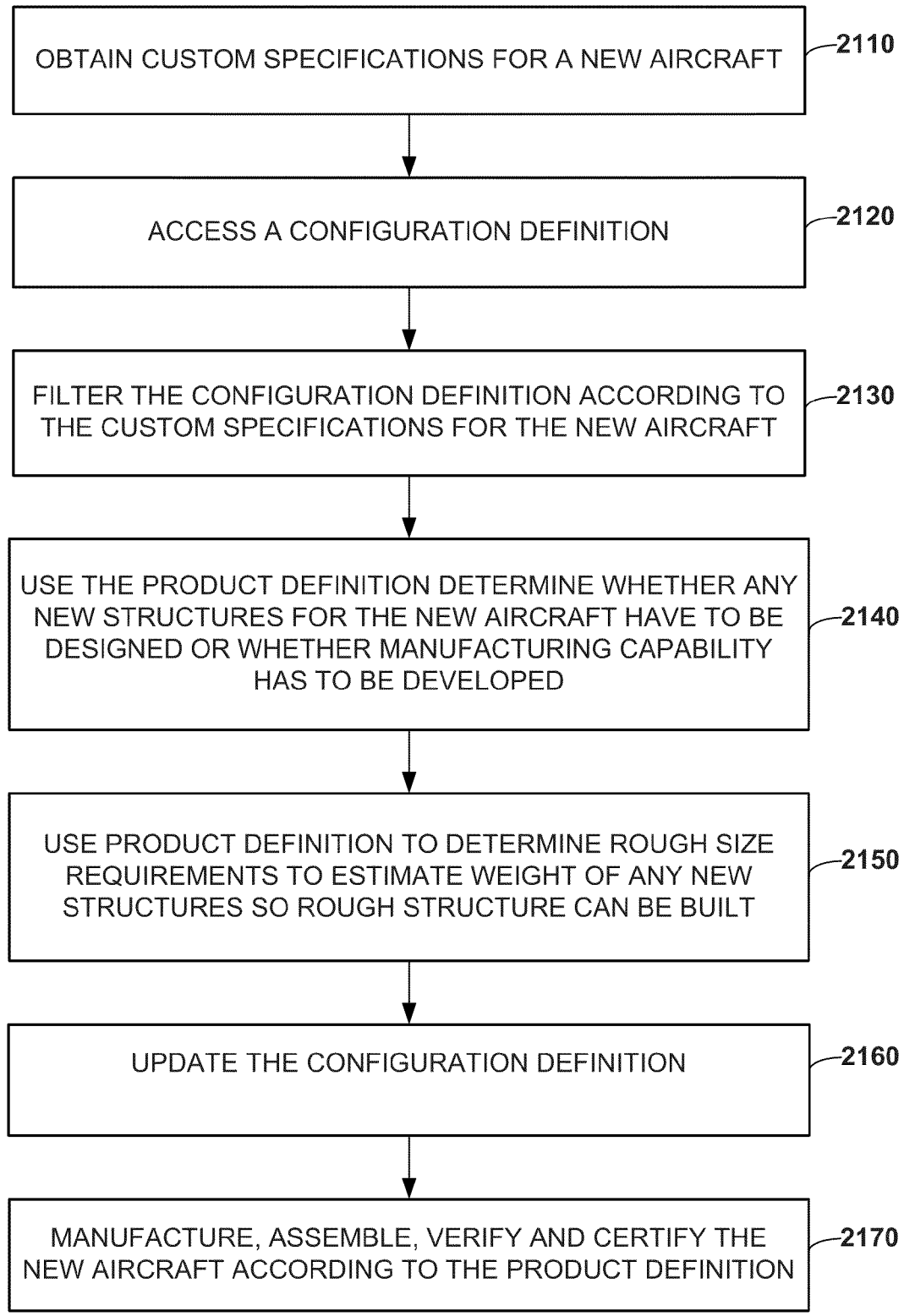
FIG. 21 is an illustration of a method that includes providing information about designs and manufacturing capability for a new aircraft.

Reference is made to FIG. 21. At block 2110, custom specifications for a new aircraft are obtained. For example, a customer is presented with a baseline model. The aircraft manufacturer already has existing designs and manufacturing capability to produce the baseline model. The customer then specifies modifications to the baseline model (e.g., stretch fuselage). An "option" refers to a potential modification to a product such as the baseline model.

At block 2120, a configuration definition is accessed from a computer such as a server. The configuration definition specifies engineering designs and manufacturing capability of aircraft structures that have already been designed and manufactured. The aircraft structures include major component assemblies such as the body, wings, and engines (see, for example, FIGS. 5 and 7). Structures may include subassemblies. For instance, the body may include a nose section, mid section and tail section. Structures of the mid section, for instance, may include barrels, doors, floors, and windows. Structures of the barrels may include frames, stringers and skins. The granularity can extend to elements of a frame (webs and bases). The same granularity can exist for other components inside a body, such as seats, seating tracks, galleys, lavoratories, etc.

Structures such as engines might be treated as "black boxes." Details of the engines (e.g., compressor designs) are left to the vendor. The configuration definition only provides functional details and details about how the engines are integrated with (e.g., mounted to) the aircraft.

The engineering designs include, but are not limited to, solid models, engineering intent, and part-to-part relationships. The product configuration stores electronic files (e.g., CAD files) of the solid model designs and part-to-part relationships. The product configuration also stores electronic files (e.g., text files) of supporting documentation.

The engineering intent includes engineering requirements such as the tolerance of items relative to one another for location requirements, finish requirements, etc. These items are identified by callouts as described in assignee's U.S. Pat. No. 7,471,989 issued Jul. 29, 2008 and incorporated herein by reference.

The manufacturing capability includes manufacturing structures. The manufacturing structures include, but are not limited to, tooling, and description of a manufacturing facility. For a discussion of tool design and instructions, see assignee's U.S. Pat. No. 7,580,769 issued on Aug. 25, 2009 and incorporated herein by reference.

At block 2130, the configuration definition is filtered according to the custom specifications for the new aircraft. The filtering includes selecting existing designs and identifying existing manufacturing capability to fabricate structures for the new aircraft. The filtering produces a product definition that provides a list of electronic files and/or links to files of all of the existing aircraft structure designs, instructions on how to manufacture the listed structures, instructions on how to assemble the listed structures, instructions on how to validate the new aircraft, and product and process analysis results. Thus, the product definition is a data structure that identifies all components of existing designs and build processes, including designs, manufacturing, tooling, analysis, supplier management, and other knowledge that will be reused to produce the new aircraft. This information can all be brought together to analyze any new modifications (that is, options).

The product definition may be partial or complete. The product definition will be complete if the new aircraft can be designed and manufactured entirely from existing designs and existing manufacturing capability. The product definition will be partial if new structures need to be designed and/or new manufacturing capability is required.

At block 2140, the product definition is used to determine whether any new structures for the new aircraft have to be designed or whether manufacturing capability has to be developed. The product definition provides an existing view of product and manufacturing capabilities. If the design and/or manufacturing capability for a customer modification does not exist, the product definition may identify needed design and/or manufacturing capability. The customer can then decide whether incur the costs (e.g., money, time) of creating new designs and/or manufacturing capability.

Thus, a method herein directs the design and manufacture of a new aircraft. Manufacturing capability is considered during the design of the aircraft, and existing designs and existing manufacturing capability are reused. As a result, a method herein reduces the design-to-delivery time of a new aircraft.

A method herein can reduce the design-to-delivery time in other ways.

At block 2150, the product definition can provide rough size requirements for any new aircraft structures (for example, using the size requirements of the structures in the baseline model). The rough size requirements are used to estimate weight of the new structures so rough structure can be built prior to completing engineering design of the new structures. For example, a customer desires to place an existing galley at a different location within a cabin. All components of the cabin and galley exist. The proposed customer modification would require design and manufacturing for relocating the galley.

At block 2160, the configuration definition is updated to reflect changes in designs and manufacturing capability. As a first example, as new aircraft structures are designed and manufacturing capability is developed, the designs and capability are added to the configuration definition. As a second example, the configuration definition is updated to reflect existing structures whose design has become obsolete or whose manufacture has been discontinued. The updating is a concurrent process controlled by the lifecycle of the product definition components.

At block 2170, the structures of the aircraft are manufactured according to the designs and manufacturing capability indicated in the product definition, and the new aircraft is assembled according to the instruction provided in the product definition. The aircraft is then verified and certified according to the product definition. The verification and certification may include tracking any test configurations indicated in the product definition.

Reference is now made to FIG. 22, which illustrates a system 2210 for directing a new aircraft from design to delivery. The system 2200 includes a configurator 2210. The configurator 2210 may include a server system 2220 that accesses the configuration definition from an electronic database 2230, and, upon request, makes the configuration definition available to discipline users 2240.

The discipline users 2240 refer to any users who need access to a product definition. The discipline users 2240 may include designers, configuration managers, supplier management personnel, sales people, and other people who are involved throughout the lifecycle of an aircraft. These users may access the configurator 2210 via computers such as PCs and workstations.

Some of those discipline users 2240 will store designs and other information to the database 2230. Information for the configuration definition may be created by a multiplicity of authoring tools, such as CAD, PDM, FEM, and kinematics. These authoring tools may communicate with the database 2230, which understands defined objects such as Part Master, Part Revision, Line number, Applicability, etc.

The configuration definition will now be discussed with respect to specific examples. In these examples, the configuration definition may be a maximum configuration definition that covers all existing options. The configuration definition includes groups and subgroups of structure definitions. Each structure definition includes geometry, assembly, engineering requirements, manufacturing operations, and applicability expressions. An applicability expression identifies the customer products to which the component may be applied. For example, applicability would specify "Option A on aircraft 1 to 10."

Most of the examples below are associated with commercial aircraft. However, a method and system herein are not limited to commercial aircraft.

Figure 1:
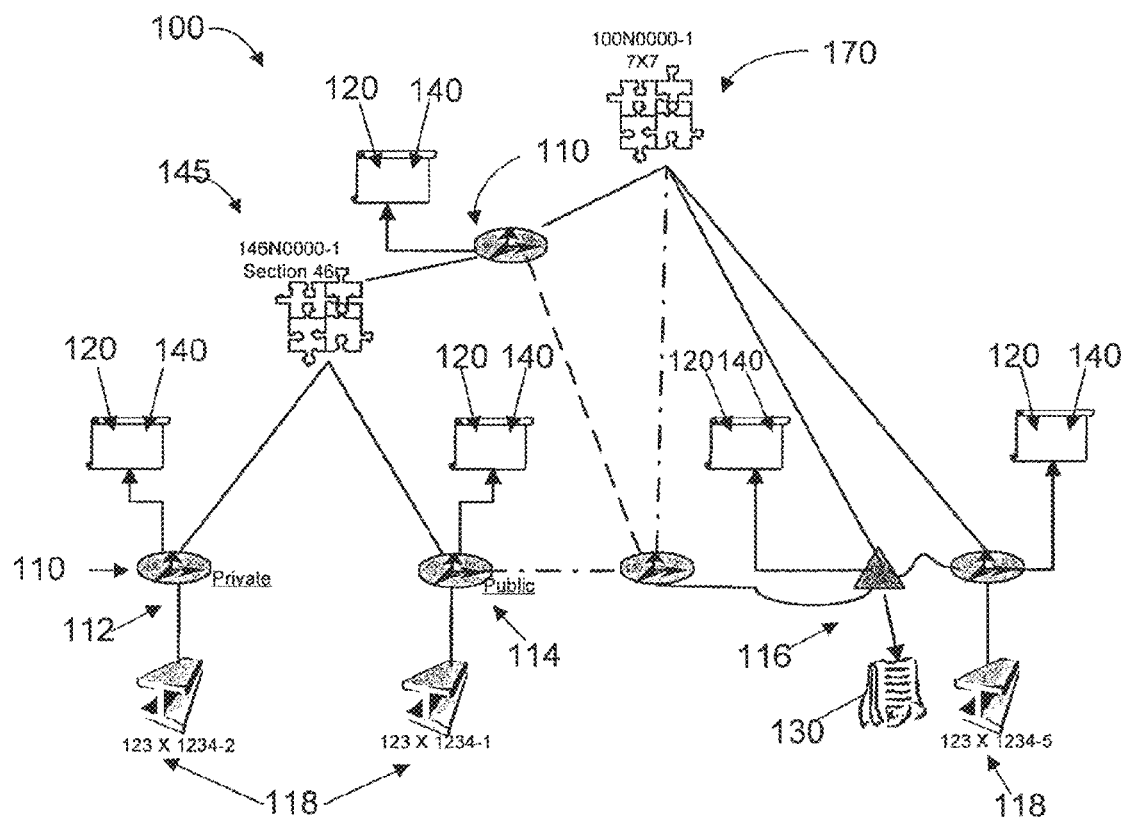
FIG. 1 is an illustration of an option-based product definition process.
Figure 2:
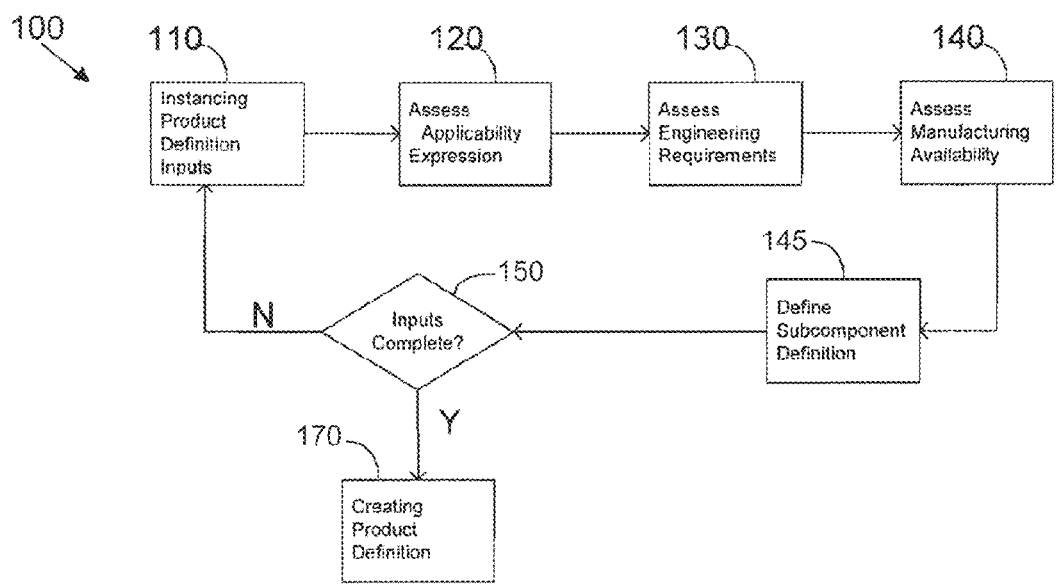
FIG. 2 is a flow chart of an option-based product definition process.

Reference is now made to FIGS. 1 and 2, which illustrate a process 100 including instancing usage-based product definition inputs 110. The usage-based product definition inputs may include one or more private instancings 112, one or more public instancings 114, and one or more engineering requirement callouts 116. The instancing of usage-based product definition inputs 110 may draw upon one or more parts 118, and may depend from one or more applicability expressions 120, and from one or more engineering requirements 130. The process 100 assesses the one or more applicability expressions 120, engineering requirements 130, and manufacturing availabilities 140 to determine whether the product definition inputs 110 are available and valid. A product subcomponent definition 145 may then be generated. At a decision block 150 (FIG. 2), it is determined whether additional product definition inputs are needed. If so, then the process repeats with the instancing of additional product definition inputs 110, and additional assessing of applicability expressions 120, engineering requirements 130, and manufacturing availabilities 140. When all necessary product definition inputs have been received, then the product definition 170 is created.

An applicability expression may include operands and Boolean operators. The operands may be option, serial range (e.g. start line number and end line number), date range (e.g. start date and end date), milestone (e.g. a named date), lot, and other suitable operands. (Availability may be thought of as an applicability expression without option operands.) The Boolean operators may include, but are not limited to, NOT, AND, OR, and XOR. The NOT operator evaluates true when the option following the operator is not in the product configuration specification. The AND operator evaluates true when the option on both sides of the operator is included in the product configuration specification. The OR operator evaluates true when the option on either side or both sides of the operator is included in the product configuration. The XOR operator evaluates true when only one option on either side of the operator is included in the configuration specification. Precedence rules for the Boolean operators are shown in the following table. Operators of equal precedence are evaluated left to right.

| First | NOT |
| --- | --- |
| | AND |
| | OR, XOR |

A typical applicability applied to a part instance will include both option operands and serial range operands. For example, (2520B142) AND (328→∞) specifies that the part instance is applicable in products for Option 2520B142 delivered from line number 327 and on.

Reference is made to FIG. 14, which illustrates an example of an applicability 1400. A part instance 1402 of a barrel 1404 is applicable on a product if a product configuration specification contains the option "Paper" and is for the Customer Design Review (CDR is a scheduled Milestone event). Similarly, a part instance 1406 of a Spring2 is applicable for the option "LightDuty" and for Line Number 1 through Line Number 199. A part instance 1408 of Spring3 is applicable for the "LightDuty" option from Line Number 200 and on. This could indicate that Spring2 is cutover to Spring3 on Line Number 200.

As another example, applicability may be defined in the context of a domain. Examples of an applicability domain include Engineering and Manufacturing. In one embodiment, the applicability in the Engineering Domain and the Manufacturing Domain will be identical by default for any particular item (a part instance or requirement callout, for example). There are business scenarios where the Manufacturing Domain applicability will extend the availability of a superseded part beyond what is defined in the Engineering Domain, but the superseded part is removed with an out-of-sequence process so that in the end, the Engineering definition is satisfied.

Reference is now made to FIG. 15, which illustrates two examples of configuration specifications 1500, 1510 as applied to FIG. 14. The configuration specifications may be maintained for the life of the product.

Decisions on options to be offered and when those options will be available may be determined, for example, by customer requirements, product management team, and integrated product teams. A work statement may be developed that defines and authorizes execution of a work plan, including identification of each element to be performed, one or more options to be implemented, and a scheduled sequence for implementation.

In some embodiments, a manufacturing engineer may perform process planning and analysis activity, which includes associating product data to a process structure representing the manufacturing and assembly process, and managing that information for various configurations. The process structure preferably accounts for every element of the product definition and may facilitate manufacturing analysis, e.g., assembly simulation, process flow analysis, etc. When the assembly process calls for producing discrete assemblies for subsequent installation on a production line, the manufacturing engineer creates assembly groupings, and organizes them in hierarchies. These assembly groupings are referred to as manufacturing assembly plans and are exposed through the process structure. It is preferred that the manufacturing engineer creates and manages the majority of assemblies required to fabricate the product. This suggests that the product structure remain as "flat" as possible with the part and requirement instances associated directly to their product.

Process planning activities may be performed in the context of a 3D virtual product environment. Product data, from various levels of the product, is made available in the context of the plan being developed. The process structure supports definition and management of assembly sequence and sequence analysis data such as assembly simulations. A control station may group and organize the installation plans to be performed within factory locations for a product. Control stations may be arranged in a precedence sequence by assigning the sequence availability. The availability of a control station is in the context of the product and may be derived from control station predecessor relationships.

Figure 3:
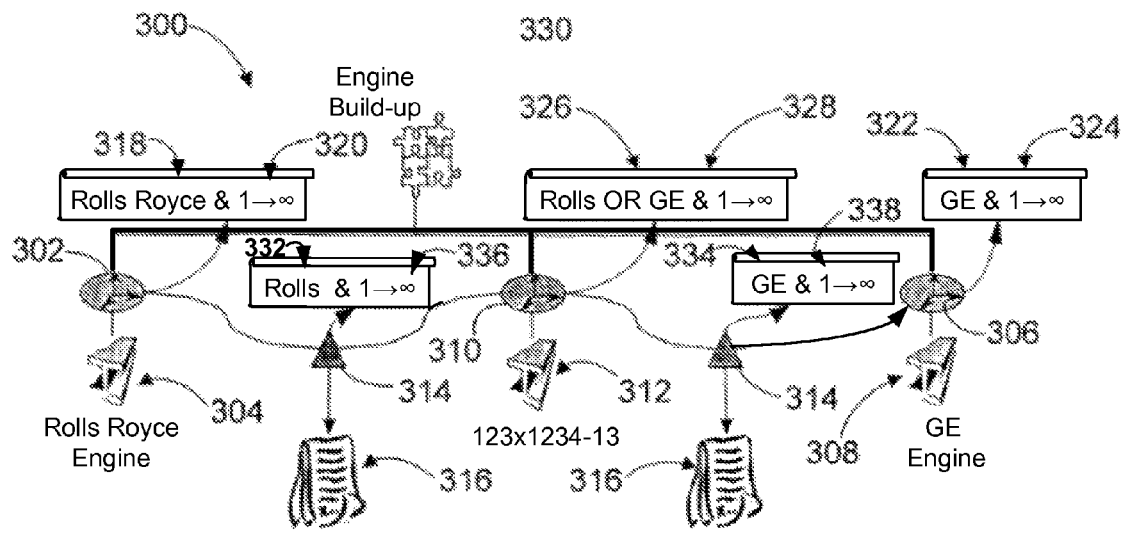
FIG. 3 is an illustration of an option-based product definition process for an engine build-up.

Reference is now made to FIG. 3, which illustrates that both parts and requirements may be instanced onto products. The instantiation may contain the applicability to the product and its location on the product (if required). FIG. 3 illustrates an example of an option-based product definition process 300 for an engine build-up. In the example of FIG. 3, the process 300 includes a first instance 302 calling for a first engine type 304 (e.g. a Rolls Royce engine), a second instance 306 calling for a second engine type 308 (e.g. a General Electric engine), and a third instance 310 calling for another part 312. One or more engineering requirement callouts 314 may result in corresponding engineering requirements 316. The process 300 may further include assessing a first applicability expression 318 and a first manufacturing availability expression 320 based on the first instantiation 302. Similarly, a second applicability expression 322 and a second manufacturing availability expression 324 may be assessed based on the second instantiation 306, and a third applicability expression 326 and a third manufacturing availability expression 328 may be generated based on the third instantiation 310. As further shown in FIG. 3, fourth and fifth applicability expressions 332, 336 and fourth and fifth manufacturing availability expressions 334, 338 may be generated based on the engineering callouts 314. Finally, a usage-based engine configuration definition 330 may be generated.

A product may be decomposed into sub-products to form a hierarchy. This structure of products may be defined by instancing a product, the instanced product being filterable by the product configuration specifications of the highest-level product. Alternately, a component configuration specification may be instanced (i.e. a uniquely configured item) wherein the product is filtered by its component configuration specifications dependent on the availability of the highest-level product.

Figure 4:
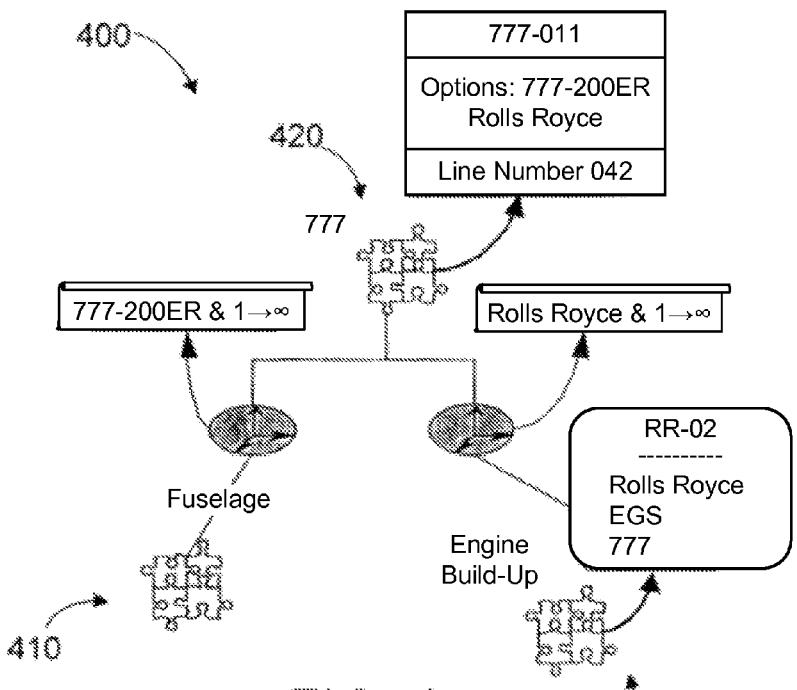
FIG. 4 is an illustration of an option-based product definition process for an aircraft.

Reference is now made to FIG. 4, which illustrates an example of an option-based product definition process 400 for an aircraft. In the example of FIG. 4, a fuselage product 410 is instanced onto an aircraft 420. Similarly, an engine build-up component configuration specification 430 is instanced onto the aircraft 420. The options, within each of the products (aircraft 420 and engine build-up 430) may be independent of each product.

Figure 5:
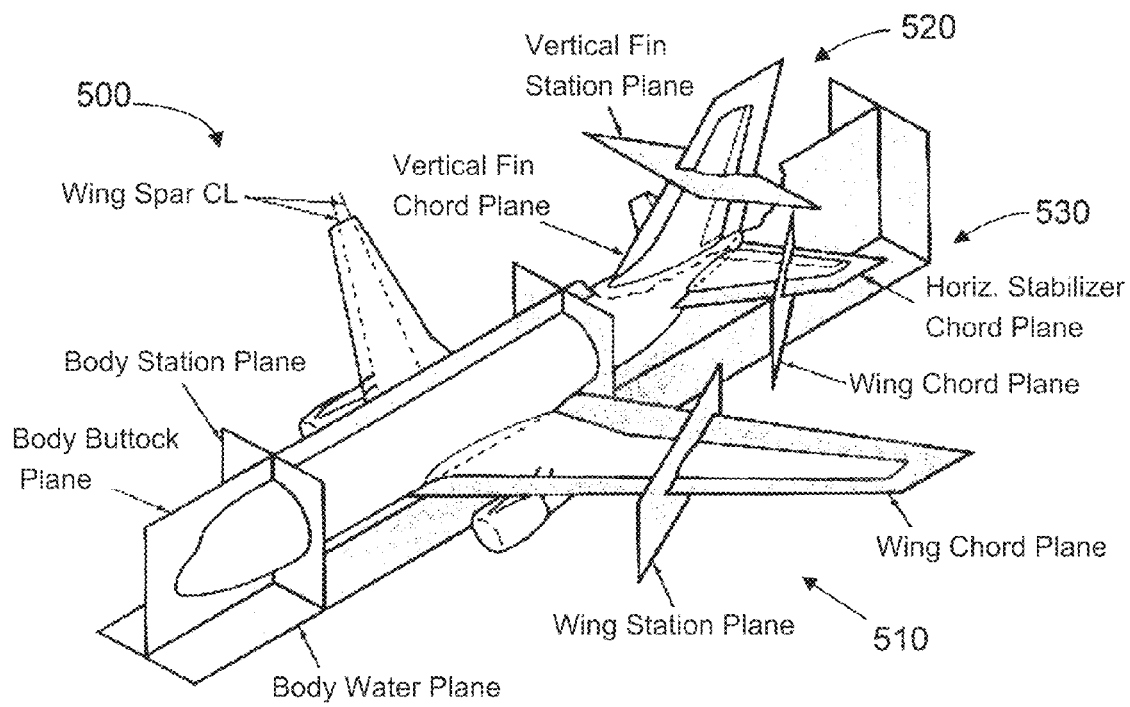
FIG. 5 is an illustration of multiple coordinate systems of a representative aircraft.

Reference is now made to FIG. 5, which illustrates an example of modeling different components of the product in their own coordinate system. Such modeling may be convenient for aircraft and other relatively large products. In the example of FIG. 5, an aircraft has a plurality of coordinate systems. The aircraft 500 includes a wing 510, a vertical stabilizer 520, and a horizontal stabilizer 530, each having its own respective coordinate system.

Figure 6:
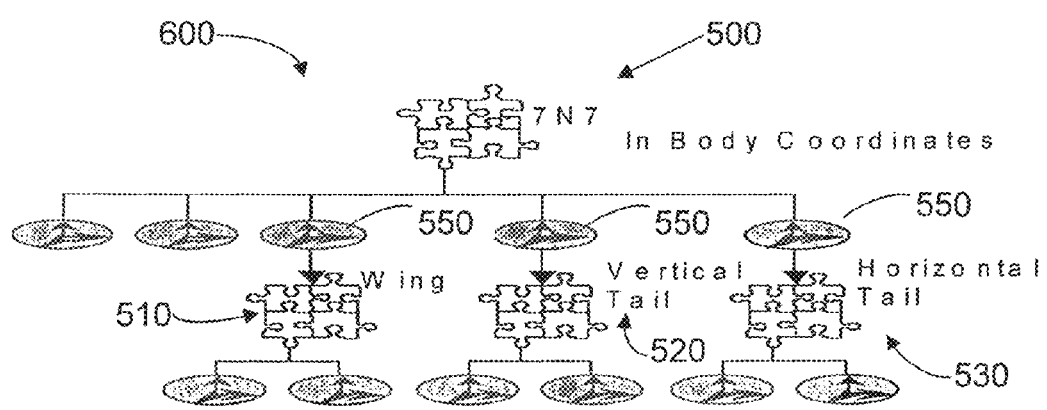
FIG. 6 is an implementation of an option-based product definition process for the aircraft of FIG. 5.

FIG. 6 is an implementation of an option-based product definition process 600 for the aircraft 500 of FIG. 5. The implementation enables the wing 510, vertical stabilizer 520, and horizontal stabilizer 530 to be modeled in their own coordinate spaces. The instances 550 of the products manage the transformation of these coordinate systems to a body coordinate system.

Figure 7:
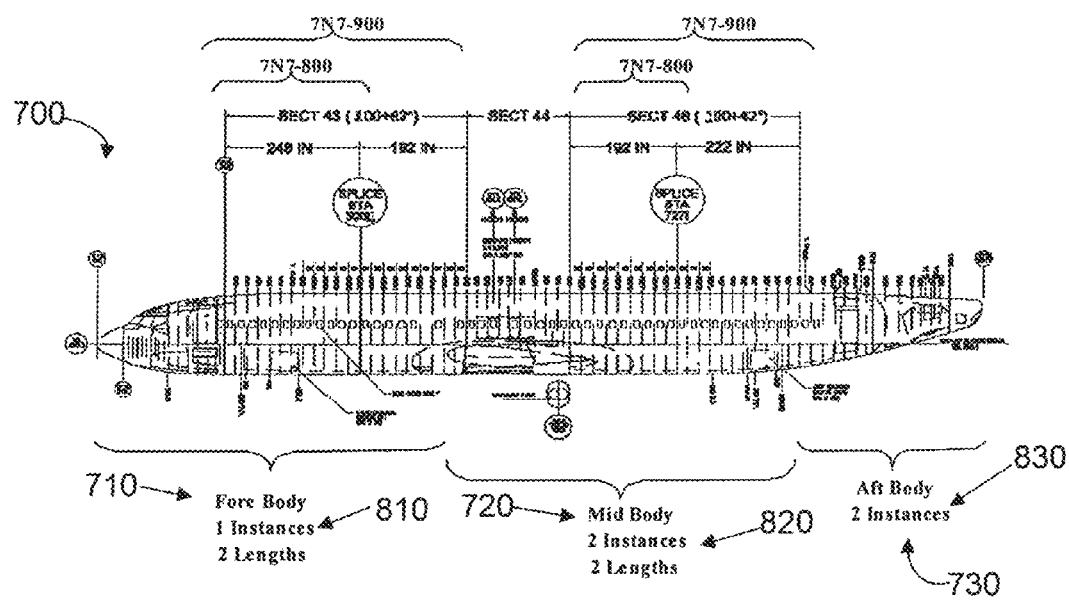
FIG. 7 is an illustration of an aircraft family.

Reference is now made to FIG. 7. For some products, it may be desirable to develop a family of products having some degree of commonality. FIG. 7 illustrates an example of a family of airplanes having different lengths. In this example, the aircraft family 700 includes a 7N7-800 model and a 7N7-900 model, with the 7N7-900 model adding length to a fore body 710 and a mid body 720 products. Section 41 and Section 43 are managed as the fore body 710, Section 44 as the mid body 720, and everything aft of Section 44 as an aft body 730 (wing, vertical stabilizer, etc, are not shown, but would also be included). In this example, the fore body 710 has two configurations (or lengths), one for the 7N7-800, and one for the 7N7-900 that would include all of the design instances added by the stretched derivative. Further, the mid body 720 has two instances, one for the 7N7-800 derivative, and one for the 7N7-900 derivative that is translated back by a specified distance (e.g. 192 inches, the added length of the fore body 710). Similarly, the aft body 730 also has two instances, one for the 7N7-800, and one for the 7N7-900 that is translated back by a second specified distance (e.g. 414 inches, the added length of the fore body 710 plus the added length of the mid body 720).

Figure 8:
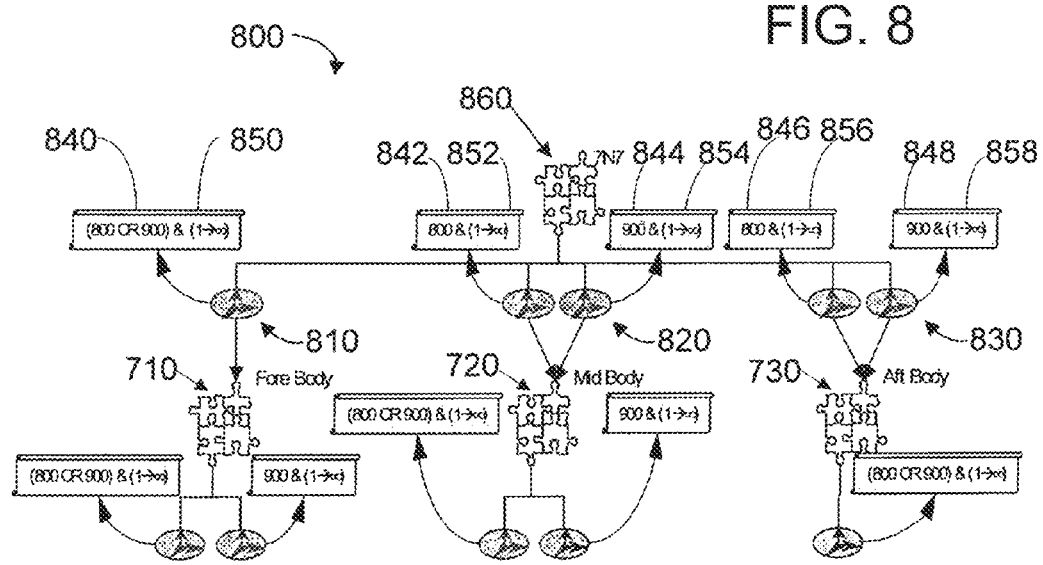
FIG. 8 is an illustration of an option-based product definition process for the aircraft family of FIG. 7.

Additional reference is made to FIG. 8, which illustrates an option-based product definition process 800 for the aircraft family 700 of FIG. 7. Each of the fore body 710, mid body 720, and aft body 730 may be instanced onto the product definition process 800 by a fore body instance 810, a pair of mid body instances 820, and a pair of aft body instances 830. Each of these instances 810, 820, 830 invokes corresponding applicability expressions 840-848, and also corresponding manufacturing availability expressions 850-858, respectively. The instances 810, 820, 830 further combine to form a product definition 860.

Figure 9:
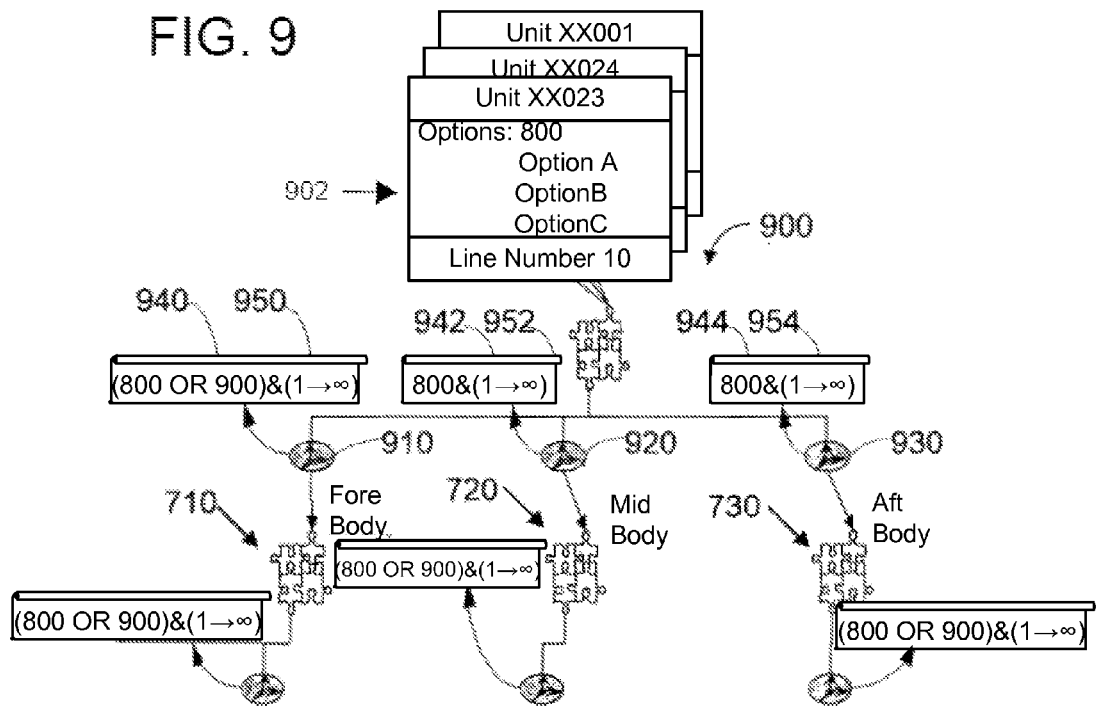
FIG. 9 is an illustration of a result of applying a product configuration specification to the product definition process of FIG. 8.

Additional reference is made to FIG. 9, which illustrates a representative result 900 of applying a product configuration specification 902 to the product definition process 800 of FIG. 8. The product configuration specification 902 is that of the 7N7-800 aircraft. The product configuration specification 902 includes an appropriate fore body instance 910, mid body instance 920, and aft body instance 930 that provides correspondingly appropriate fore body applicability and manufacturing availability expressions 940, 950, mid body applicability and manufacturing availability expressions 942, 952, and aft body applicability and manufacturing availability expressions 944, 954.

Figure 10:
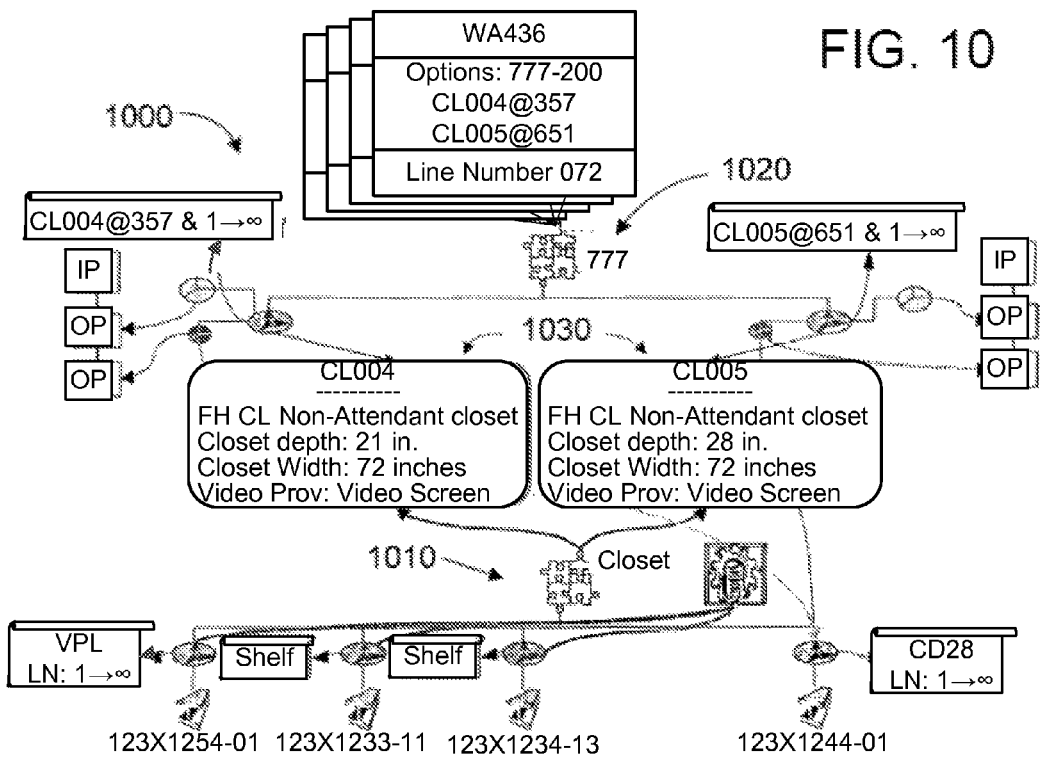
FIG. 10 is an illustration of an option-based product definition process having a plurality of configurations of a sub-product.

Reference is now made to FIG. 10. Certain items may occur multiple times on a particular product, and may have different configurations at each location. FIG. 10 illustrates an example of an option-based product definition process 1000 having a plurality of configurations of a sub-product 1010. In this example, the sub-products 1010 are closets. As shown in FIG. 10, there may be multiple closets 1010 on an aircraft 1020 and multiple closet configurations 1030 (widths, shelves, rods, etc.). To insure that the correct closet configuration 1030 is used at a particular location, specific configurations of the closet 1010 are instanced in the higher-level product 1020. Other sub-products that may also be instanced multiple times on the aircraft 1020 include but are not limited to lavatories, galleys, class dividers, and many other sub-products.

Figure 11:
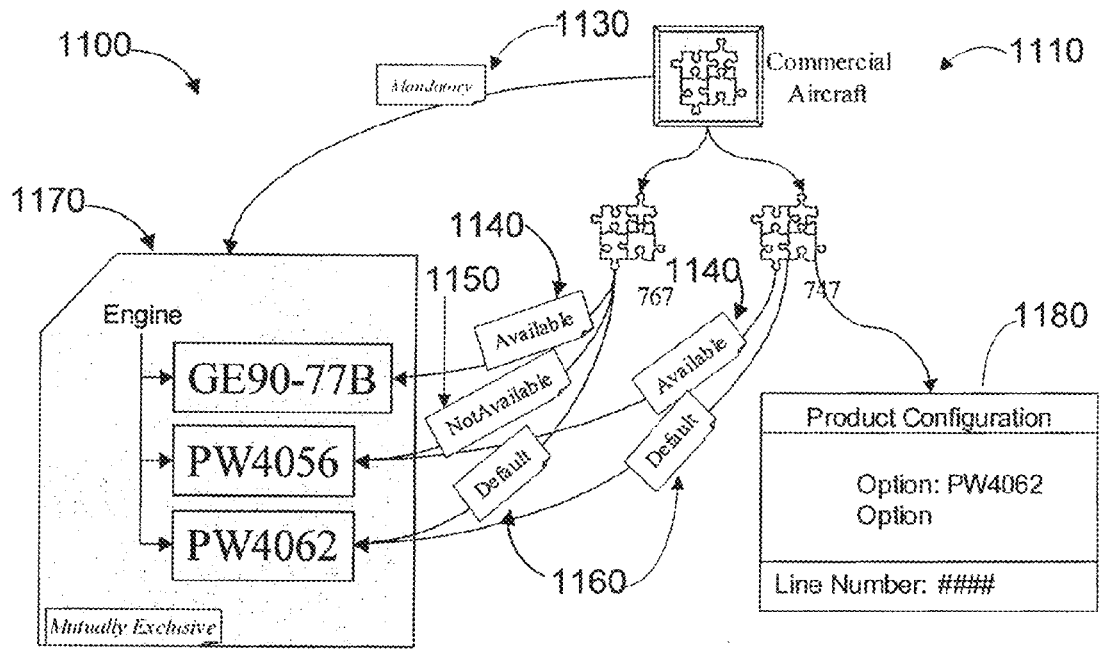
FIG. 11 is an illustration of a product class configuration rule set.

Reference is now made to FIG. 11. A product class (or grouping of products) may be defined and may provide a mechanism to apply certain configuration rules that apply to an entire set of products. FIG. 11 illustrates an example of a product class configuration rule set 1100. The product class 1110 (e.g. "Commercial Aircraft") may contain an entire set of airplane products (e.g. Model Nos. 737, 747, 757, 767, 777, etc. commercially available from The Boeing Company). The product class configuration rule set 1110 may include one or more mandatory configuration rules 1130, available configuration options 1140, configuration prohibitions 1150, and configuration defaults 1160 for any desired sub-product 1170. A product configuration 1180 may be defined that contains a plurality of instances that make up a desired product design.

In another aspect, an option is a statement of functionality or service that may be selected to define a specific configuration of a product. Options may be used in applicability statements to control when part instances, product instances, manufacturing assembly plans, etc. are valid for a particular unit of a product. Thus, options may also be used in configuration specifications to define the configuration of the product.

Figure 12:
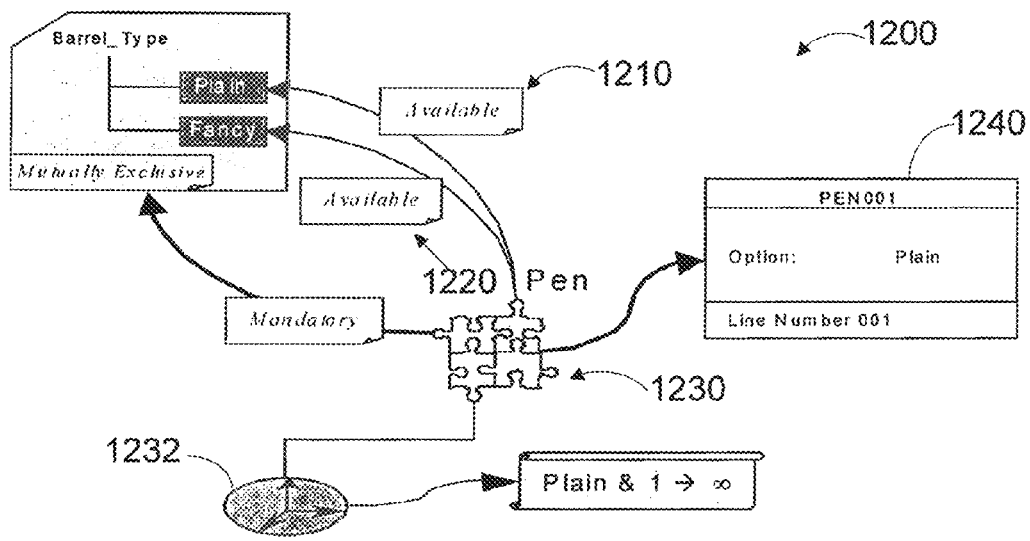
FIG. 12 is an illustration of a configuration rule set of a pen product.

Reference is now made to FIG. 12, which illustrates a configuration rule set 1200 of a pen product 1230 that has both a plain option 1210 and a fancy option 1220. An instance 1232 is applicable on the pen 1230 for the plain option 1210 and a product configuration specification 1240 will evaluate the pen product 1230 for the plain option 1210.

Options may be defined as "default", "available", "not available", or other suitable designations. A "default" option may also be defined for a valid configuration of a product (i.e., it is automatically specified), and may be replaced by an "available" option in a valid configuration of the product. For instance, a single panel door may be the default option on a particular aircraft lavatory, but the default may replaced with an available bi-fold door option. An option that is defined as "not available" for a specific product cannot be specified in a valid configuration specification of that product.

An option category is a classification of options into groups that provide similar functionality. An option category may be associated to products or product classes. Examples of option categories may include, for example, engines, voice communications, weapon systems, or any other desired sub-components or product characteristics. Option categories may implement rules that may be defined mandatory or mutually exclusive. A mandatory option category includes one or more options that must be specified in a configuration specification and is defined on the relationship between the option category and the product or product class. A mutually exclusive option category provides that one or none of the options within the category must be specified in the configuration specification.

Reference is once again made to FIG. 11, which illustrates an option category for engines 1130 associated to the product class of "Commercial Aircraft" 1110. An engine in the engine option category 1130 is a mandatory option class, which must be specified for any airplane contained in the Commercial Aircraft product class 1110. The option category engine 1130 contains all of the options for the different engines used on commercial aircraft. The PW4056 option is available for a 747 product, but is not available for a 767 Product. FIG. 11 also illustrates that the various engine options within the option category are mutually exclusive, that is, all of the engines on the aircraft must be of one specified option type.

Configuration rules may be defined in addition to the rules enforced with option categories. In some examples, configuration rules can have two different behaviors: (1) to validate the configuration specification, and (2) to populate the configuration specification. The behavior of a particular configuration rule may be set when the rule is created. These configuration rules may define option sets (or packages), contingencies between options, and exclusions between options.

Option sets may be defined as a group of options with a rule of the form: "If Option A, then Option B, Option C, Option D", etc. Thus, if Option A is included in a product configuration specification, then Option B, Option C, and Option D are also necessarily included. Contingent options may also be defined. Contingent options are options that are valid only if another specified option is also included in the configuration. Contingent options may be defined with a rule of the form: "If Option B, then only if Option A", where Option B is contingent on Option A. Further, exclusion options may be defined which are not compatible with options in other option categories (as opposed to mutually exclusive options which apply only to options within the same option category). For example, certain options that are valid on passenger airplanes may not be valid on freighter airplanes, defined as "If Option A, then NOT Option B" (e.g. "If Passenger Then NOT Heavy Duty Cargo Handling").

When referring to data in a lower-level product from a higher-level product, the data must be available in the context of that higher-level product. To make the data available, public and private designators may be used. Lower level data are visible in most user interface depictions of the structure but cannot be referenced by other data without being made public. This is illustrated in FIG. 13.

An instance may be made public by a discipline. For example, an instance from a lower level product may be consumed by manufacturing engineering at a higher-level product. That instance is made public so that the public instance representation can be accessed at the higher-level. A public instance representation refers to the public instance within the lower level product. The public instance representation maybe filtered through the instance of the higher-level product. The applicability of the public instance representation is the same as the public instance.

Figure 13:
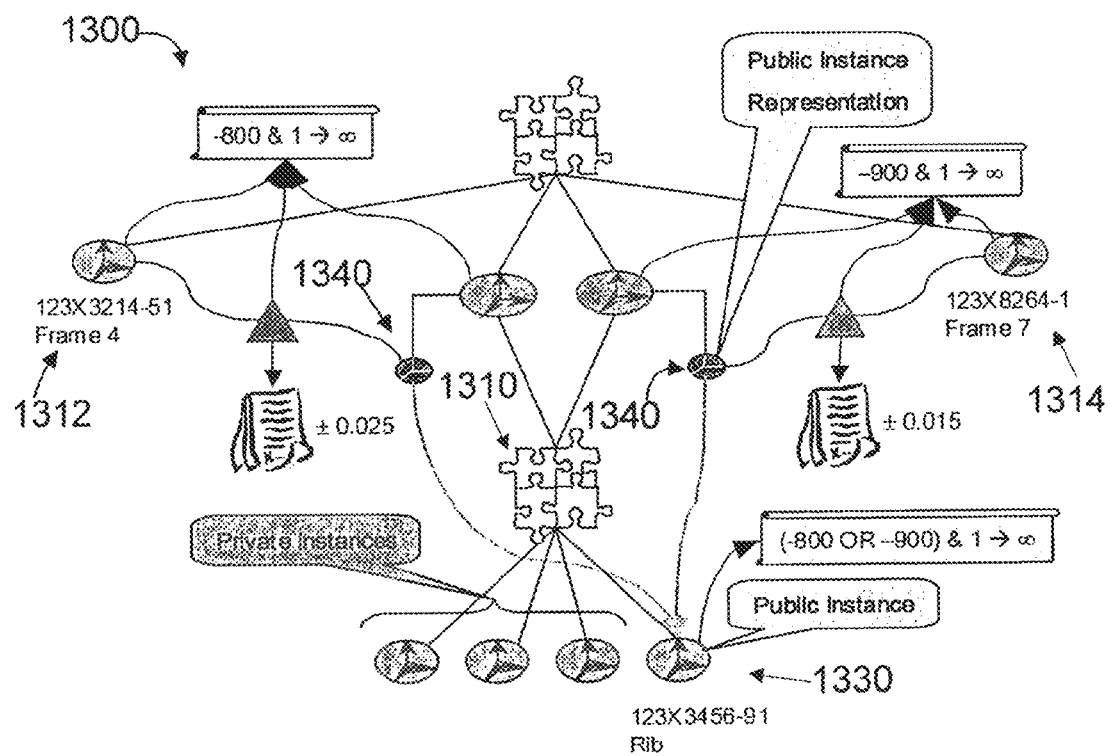
FIG. 13 is an illustration of an option-based product definition process.

Reference is now made to FIG. 13, which illustrates an option-based product definition process 1300 in which a lower-lever part 1310 (a rib) is located within a tolerance of two different upper-level parts (e.g. frames) 1312, 1314. Since the lower-level part 1310 is used in multiple locations, the unique usage of the rib 1310 in each of the part usages 1312, 1314 is referenced versus the rib itself 1310. Thus, a public instance data 1330 is available and addressable at a higher-level by one or more public instance representations 1340.

Figure 16:
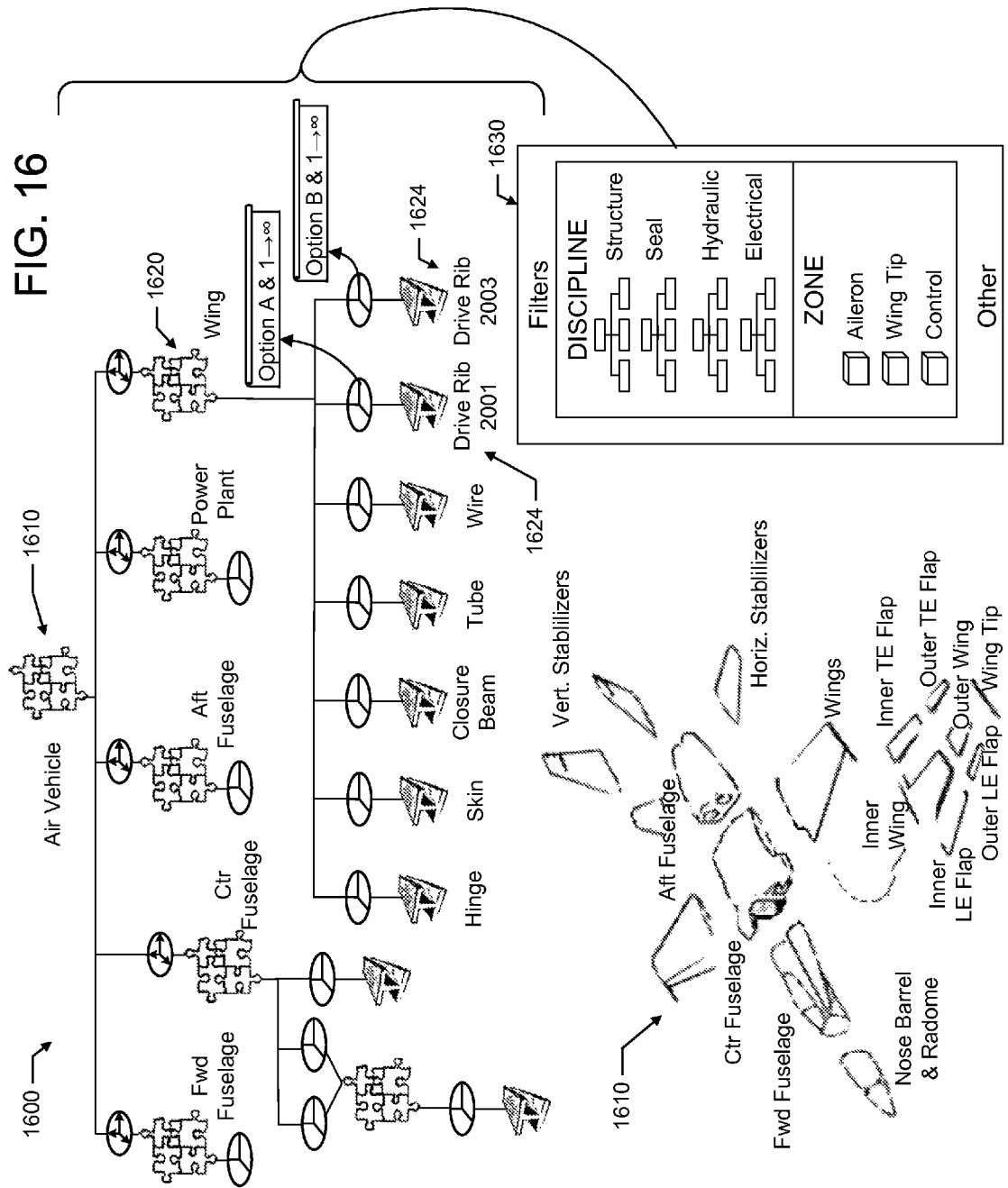
FIG. 16 is an illustration of an option-based product definition process for a tactical aircraft

Reference is now made to FIG. 16, which illustrates an option-based product definition process 1600 for a tactical air vehicle 1610. The air vehicle 1610 is partitioned into multiple sub-components (e.g. nose barrel and radome, forward fuselage, center fuselage, aft fuselage, wings, horizontal stabilizers, and vertical stabilizers). For the wing sub-component 1620, the process 1600 provides for two options of drive rib, namely, a first drive rib 1622 and a second drive rib 1624. A filter set 1630 is applied to the instancing of the process 1600 to provide one or more applicability and availability rules to ensure valid product definition of the air vehicle 1610. In the context of a 3D virtual product system, the filter set 1630 may enable a product designer to filter the product structure to get different views of a particular air vehicle configuration, or to view different air vehicle configurations.

Figure 17:
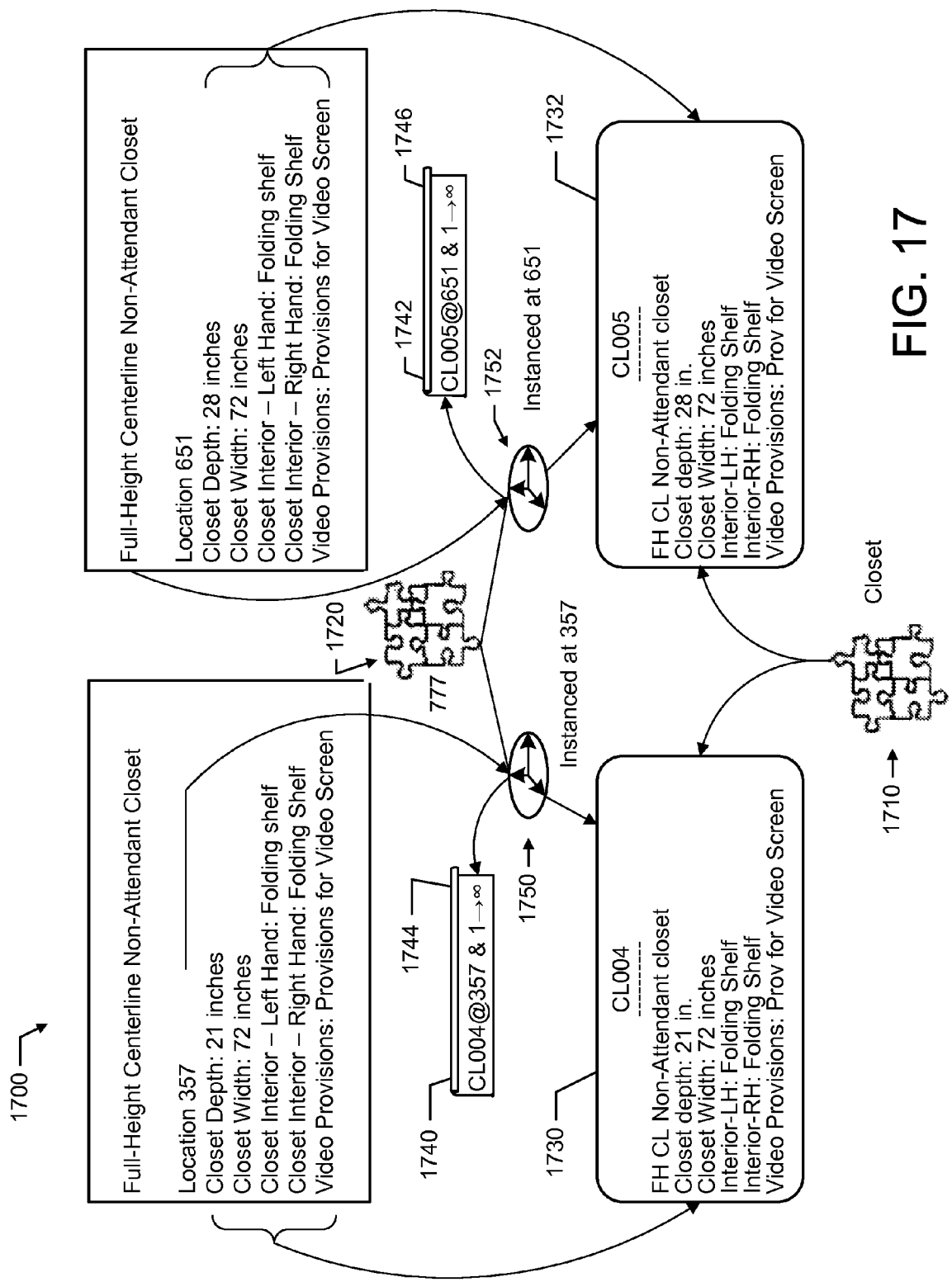
FIG. 17 is an illustration of an option-based product definition process implemented for a closet sub-component of a commercial aircraft.

Reference is now made to FIG. 17, which illustrates an option-based product definition process 1700 implemented for a closet sub-component 1710 of a commercial aircraft 1720. A customer may select (or instance) a first closet 1730 (e.g. a Full-Height Centerline Non-Attendant Closet at location 357) and a second closet 1732 (e.g. a Full-Height Centerline Non-Attendant Closet at location 651). The closets 1730, 1732 are approximately the same dimensions except for depth (21 inches deep and 28 inches deep, respectively). As specified in their respective first and second applicability expressions 1740, 1742 and manufacturing availability expressions 1744, 1746, both closets 1730, 1732 are available for Line Numbers 1 and on, (i.e., the configurations are reusable). Engineering may invoke a first instance 1750 to install the first closet 1730, and a second instance 1752 to install the second closet 1732, at the customer-specified locations and applies the unique applicability.

A "configuration at location" option may be added to the customer's product configuration specifications.

Figure 18:
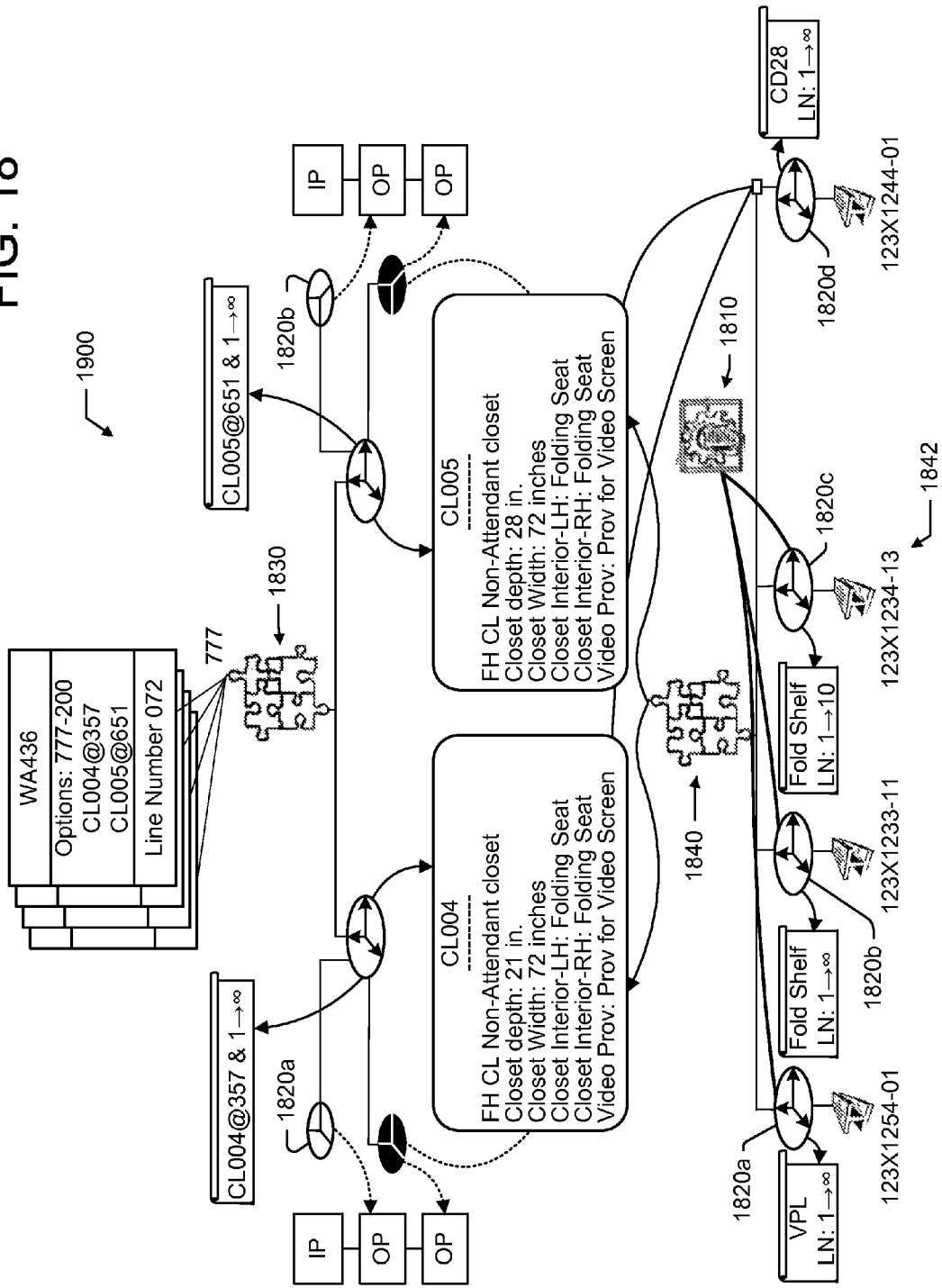
FIG. 18 is an illustration of an option-based product definition process for a closet sub-component before a customer-specified change
Figure 19:
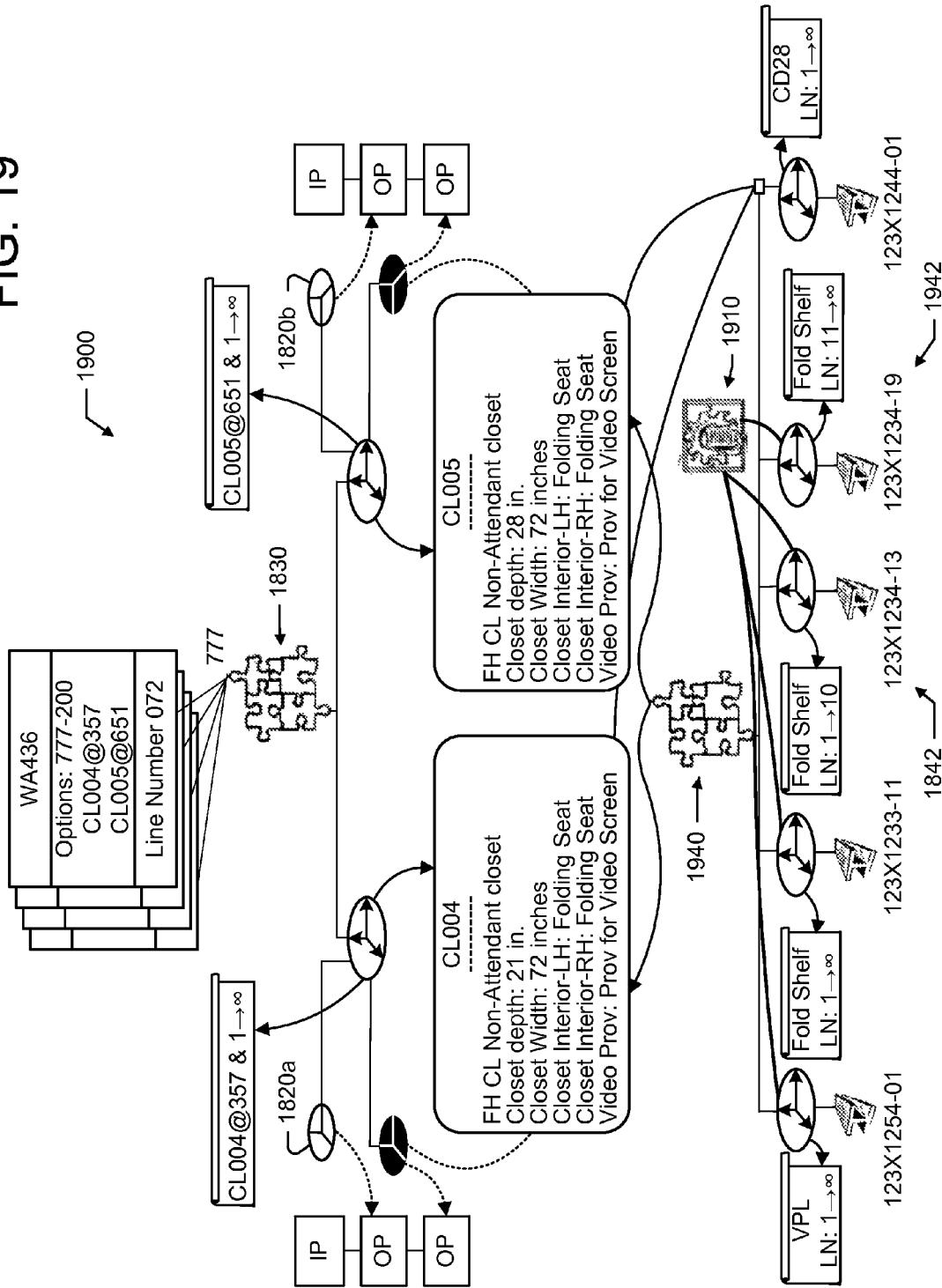
FIG. 19 is an illustration of an option-based product definition process for a closet sub-component after a customer-specified change

Reference is now made to FIGS. 18 and 19, which illustrate option-based product definition processes 1800, 1900 for closet sub-components before and after a customer-specified change. As shown in FIG. 18, a unitized manufacturing assembly plan 1810 may be created. In general, the unitized manufacturing assembly plan 1810 may be used to assemble components that support a common product with variable configurations. The configuration of this type of plan is determined by the applicability of its components. When the assembly has been completed, a tag may be affixed to the assembly denoting the unitized manufacturing assembly plan number and line number for which the assembly was built. The assembly may then be stored in a parts control area for later use in an installation plan.

The makeup of the unitized manufacturing assembly plan 1810 may be changed at any time to facilitate process changes. These changes may not require the product structure to change and may enable flexibility to change assembly configurations to support process changes. The part number identifier for the assembly may not be required to change when the assembly configuration is revised. The configuration of the unitized manufacturing assembly can be the same as, more than, or less than the associated product.

The applicability of the unitized manufacturing assembly plan 1810 may be managed by availability. When a component is included in the unitized manufacturing assembly plan 1810 the applicability will be added to and managed on the relationship between the part instance, assembly instance, or requirement callout and the operation in the unitized manufacturing assembly plan 1810.

When a component of the unitized manufacturing assembly plan 1810 is effective for a configuration not accounted for in an assembly plan, the component will be used directly on an installation plan for the line numbers not accounted for by the assembly plan. This is accomplished by specifying the availability that is not covered by the assembly plan on the manufacturing domain of the part instance. The part instance may then be declared as a "public" instance for the line numbers identified and exposed as a manufacturing instance representation for the installation plan, and provides for accountability of the part instance when it is associated to an operation. The unitized manufacturing assembly plan 1810 may be used in a shop which is the factory area where the plan is executed resulting in a physical assembly. The relationship between the unitized manufacturing assembly plan 1810 and the shop contains availability. If the plan is moved from one shop to another, it is accomplished by limiting the availability to one shop and adding availability to the other.

FIG. 18 also illustrates part instances 1812*a*-1812*d* that are designated as public. The public instance representations 1812 and manufacturing assembly representations 1820*a* and 1820*b* are consumed at the air vehicle definition 1830.

Under the "configuration at location" option, when the customer changed a closet product 1840, for example, from a first sub-part 1842 (e.g., a "−13", FIG. 18) to a second sub-part 1942 (e.g., a "−19", FIG. 19) at line 11. The process 1800 at the closet product level 1840 is impacted by the customer-specified changes. The air vehicle definition level 1830 is not impacted.

Figure 20:
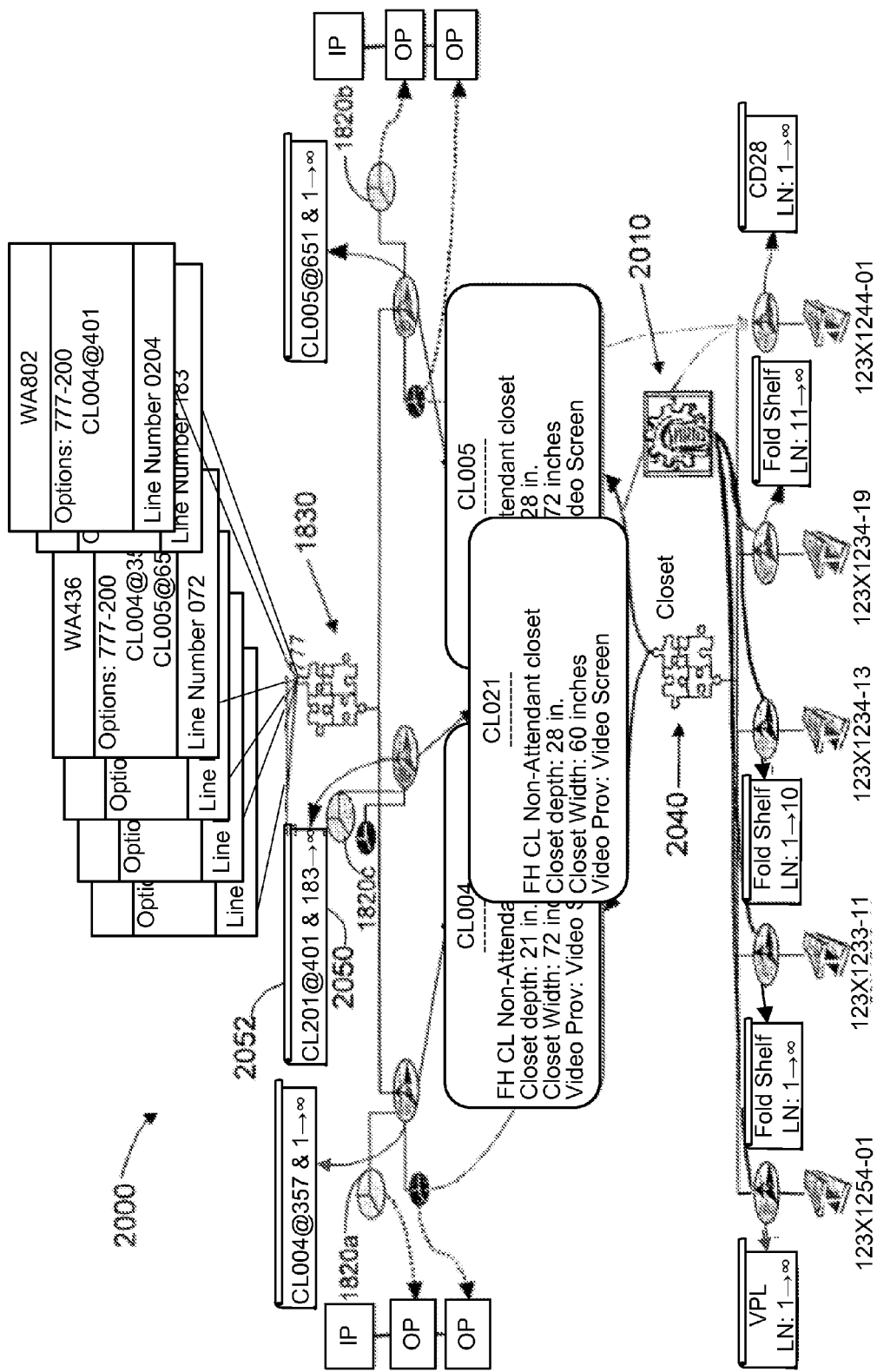
FIG. 20 is an illustration of an option-based product definition process for a closet sub-component after yet another customer-specified change.

Reference is now made to FIG. 20, which illustrates an option-based product definition process 2000 for the closet sub-component of FIGS. 18 and 19 after yet another customer-specified change. Another customer invokes a third instance 1820*c* to select a third closet sub-part 2040 (e.g. 60-inch width closet at 401). As shown in the corresponding manufacturing availability expression 2050, the third instance 1820*c* is available at Line Number 183 (this customer's first airplane 1830) and on. Also, as shown in the corresponding manufacturing applicability expression 2052, the third instance 1820*c* of the third closet 2040 (e.g. the CLO21 configuration) is created at 401.

The invention claimed is:

1. A computer-implemented aircraft design system for use with a plurality of customer-defined specifications for a new aircraft, comprising:
 a configurator including a database storing a configuration definition that specifies existing engineering designs and manufacturing capabilities associated with a plurality of existing aircraft structures used in a plurality of baseline aircraft models that have already been designed and manufactured, and a server system for accessing the database;
 a processor configured to:
  receive the plurality of customer-defined specifications for the new aircraft, the plurality of customer-defined specifications including at least one modification to one of the plurality of baseline aircraft models;
  access the configuration definition from the configurator via the server system;
  filter the configuration definition according to the plurality of customer-defined specifications for the new aircraft to identify selected engineering designs and manufacturing capabilities from the existing engineering designs and manufacturing capabilities that correspond to aircraft structures associated with the plurality of customer-defined specifications; and
  generate, based on the filtering, a product definition for each of a plurality of aircraft body portions, each of which invokes corresponding applicability expressions and manufacturing availability expressions, the expressions of the plurality of aircraft body instances indicating in combination whether the new aircraft can be manufactured using existing engineering designs and manufacturing capabilities.

2. The aircraft design system of claim 1, wherein the product definition provides instructions on how to manufacture the listed structures, instructions on how to assemble the listed structures, instructions on how to validate the new aircraft, product and process analysis results and at least one of a list of electronic files and links to files of the plurality of existing aircraft structures.

3. The aircraft design system of claim 1, wherein the processor receives the plurality of customer-defined specifications as modifications to one of the plurality of baseline aircraft models.

4. The aircraft design system of claim 1, wherein the product definition identifies all components of existing engineering designs and manufacturing capabilities associated with the plurality of existing aircraft structures, including designs, build processes, manufacturing, tooling, analysis, supplier management, and other knowledge that will be reused to produce the new aircraft.

5. The aircraft design system of claim 1, wherein the product definition further provides instructions on how to validate the new aircraft.

6. The aircraft design system of claim 1, wherein the plurality of existing aircraft structures includes parts and assemblies.

7. The aircraft design system of claim 1, wherein the existing engineering designs include solid models, engineering intent, and part-to-part relationships.

8. The aircraft design system of claim 7, wherein the engineering intent includes engineering requirements.

9. The aircraft design system of claim 1, wherein the manufacturing capabilities include manufacturing structures.

10. The aircraft design system of claim 9, wherein the manufacturing structures include tooling, assembly instruction, and description of manufacturing facilities.

11. The aircraft design system of claim 1, wherein the configuration definition includes groups and subgroups of structure definitions, wherein each structure definition includes geometry, assembly, engineering requirements, manufacturing operations, and applicability expressions.

12. The aircraft design system of claim 1, further comprising using the filtered configuration definition to identify any new structures requiring development of new manufacturing capability for the new aircraft.

13. The aircraft design system of claim 12, wherein the filtered configuration definition provides rough size requirements for the new structures, and wherein the system uses the rough size requirements to estimate weight of the new structures to build rough structure prior to completing engineering design of the new structures.

14. The aircraft design system of claim 12, further comprising updating the configuration definition with engineering designs and manufacturing capabilities for any new structures.

15. An aircraft design method for use with a plurality of customer-defined specifications for a new aircraft, comprising:
 generating a database via a computer for storing a configuration definition that specifies existing engineering designs and manufacturing capabilities associated with a plurality of existing aircraft structures used in a plurality of baseline aircraft models that have already been designed and manufactured;
 accessing the configuration definition via a server system;
 receive the plurality of customer-defined specifications for the new aircraft using the server system, the plurality of customer-defined specifications including at least one modification to one of the plurality of baseline aircraft models;
 filtering the configuration definition via a processor according to the plurality of customer-defined specifications for the new aircraft to identify selected engineering designs and manufacturing capabilities from the existing engineering designs and manufacturing capabilities that correspond to aircraft structures associated with the plurality of customer-defined specifications; and
 generating, based on the filtering, a product definition for each of a plurality of aircraft body portions including one or more of a fore body portion, a mid body portion and an aft body portion, the product definitions in combination indicating whether the new aircraft can be manufactured using existing engineering designs and manufacturing capabilities.

16. The aircraft design method of claim 15, further comprising using the filtered configuration definition to determine whether any new structures for the new aircraft require new engineering design or development of new manufacturing.

17. The aircraft design method of claim 16, wherein the product definition provides rough size requirements for the new structures, and wherein the method further comprises using the rough size requirements to estimate weight of the new structures to build rough structure prior to completing engineering design of the new structures.

18. The aircraft design method of claim 15, further comprising building and assembling the aircraft structures, and certifying the new aircraft according to the product definition.

19. A computer-implemented aircraft design method for use with customer-defined specifications for a new aircraft, comprising:
 receiving, via a server system, the plurality of customer-defined specifications for the new aircraft, the plurality of customer-defined specifications including modifications to a baseline model of an aircraft;
 accessing, via the server system, a database storing a configuration definition that specifies existing engineering designs and manufacturing capabilities associated with a plurality of existing aircraft structures used in a plurality of baseline aircraft models that have already been designed and manufactured;
 searching the configuration definition to identify selected engineering designs and manufacturing capabilities from the existing engineering designs and manufacturing capability that correspond to the modifications; and
 generating a product definition for each of a plurality of aircraft body portions including one or more of a fore body portion, a mid body portion and an aft body portion, the product definitions in combination indicating whether the new aircraft can be manufactured using existing engineering designs and manufacturing capabilities.

* * * * *